(12) United States Patent
Kim et al.

(10) Patent No.: US 9,384,808 B2
(45) Date of Patent: Jul. 5, 2016

(54) ADDRESS INPUT CIRCUIT OF SEMICONDUCTOR APPARATUS

(71) Applicant: SK hynix Inc., Icheon-si Gyeonggi-do (KR)

(72) Inventors: Young Ju Kim, Icheon-si (KR); Kwan Weon Kim, Icheon-si (KR); Dong Uk Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 136 days.

(21) Appl. No.: 14/107,869

(22) Filed: Dec. 16, 2013

(65) Prior Publication Data
US 2014/0169118 A1 Jun. 19, 2014

(30) Foreign Application Priority Data
Dec. 17, 2012 (KR) ........................ 10-2012-0147190

(51) Int. Cl.
*G11C 8/00* (2006.01)
*G11C 8/10* (2006.01)
*G11C 8/18* (2006.01)
*G11C 29/02* (2006.01)

(52) U.S. Cl.
CPC .. *G11C 8/10* (2013.01); *G11C 8/18* (2013.01); *G11C 29/023* (2013.01); *G11C 29/024* (2013.01)

(58) Field of Classification Search
USPC ..................................... 365/230.06
See application file for complete search history.

(56) References Cited

U.S. PATENT DOCUMENTS

| 7,613,069 B2 * | 11/2009 | Yang .................... G11C 7/1039 365/230.08 |
| 2001/0039602 A1 * | 11/2001 | Kanda .................. G11C 7/1021 711/105 |
| 2014/0169118 A1 * | 6/2014 | Kim ......................... G11C 8/10 365/230.06 |

FOREIGN PATENT DOCUMENTS

KR   1020030078336 A   10/2003

* cited by examiner

*Primary Examiner* — Hoai V Ho
*Assistant Examiner* — Pablo Huerta
(74) *Attorney, Agent, or Firm* — William Park & Associates Ltd.

(57) ABSTRACT

An address input circuit of a semiconductor device includes: an address latch unit configured to generate latch addresses, by latching addresses sequentially provided by an external, according to a command decoding signal, wherein latch timings of each of the addresses are adjusted differently from one another; and a command decoder configured to decode a command provided from the external and generate the command decoding signal.

22 Claims, 3 Drawing Sheets

ADDRESS INPUT CIRCUIT OF SEMICONDUCTOR APPARATUS

CROSS-REFERENCES TO RELATED APPLICATION

The present application claims priority under 35 U.S.C. §119(a) to Korean application number 10-2012-0147190, filed on Dec. 17, 2012, in the Korean Intellectual Property Office, which is incorporated herein by reference in its entirety as set forth in full.

BACKGROUND

1. Technical Field

Various embodiments relate to a semiconductor memory apparatus, and more particularly, to an address input circuit of the semiconductor memory apparatus.

2. Related Art

A semiconductor device, for example, a semiconductor memory apparatus may receive an address from external and perform a read operation to data stored in a memory cell corresponding to the address.

The semiconductor device may receive an address according to the double data rate (DDR) address input mode.

In the DDR address input mode, the semiconductor device may receive the address at both of rising edge and falling edge of a clock.

The semiconductor device should be tested to check whether or not the semiconductor device performs operations normally.

In order to test the semiconductor device that may support the DDR address input mode, test equipment also should support the DDR address input mode.

However, most of test equipment cannot support the DDR address input mode but the single data rate (SDR) address input mode in which an address may be provided only at rising edge of a clock.

High-priced test equipment that may support the DDR address input mode costs a lot for testing the semiconductor device, which is burden in manufacturing costs.

SUMMARY

An address input circuit of a semiconductor device in is accordance with an embodiment of the present invention may receive an address regardless of an address input mode of test equipment (the DDR address input mode and the SDR address input mode).

In an embodiment of the present invention, an address input circuit of a semiconductor device includes: an address latch unit configured to generate latch addresses, by latching addresses sequentially provided by an external, according to a command decoding signal, wherein latch timings of each of the addresses are adjusted differently from one another; and a command decoder configured to decode a command provided from the external and generate the command decoding signal.

In an embodiment of the present invention, an address input circuit of a semiconductor device is configured to select each one from a plurality of latch signals generated by latching addresses according to a clock signal so that each of latch timings of the addresses are different from one another, and output the selected signals as latch addresses.

BRIEF DESCRIPTION OF THE DRAWINGS

Features, aspects and embodiments are described in conjunction with the attached drawings, in which.

DETAILED DESCRIPTION

Hereinafter, a semiconductor memory apparatus and a data input and output method thereof according to the invention will be described below with reference to the accompanying drawings through various embodiments.

Figure 1:
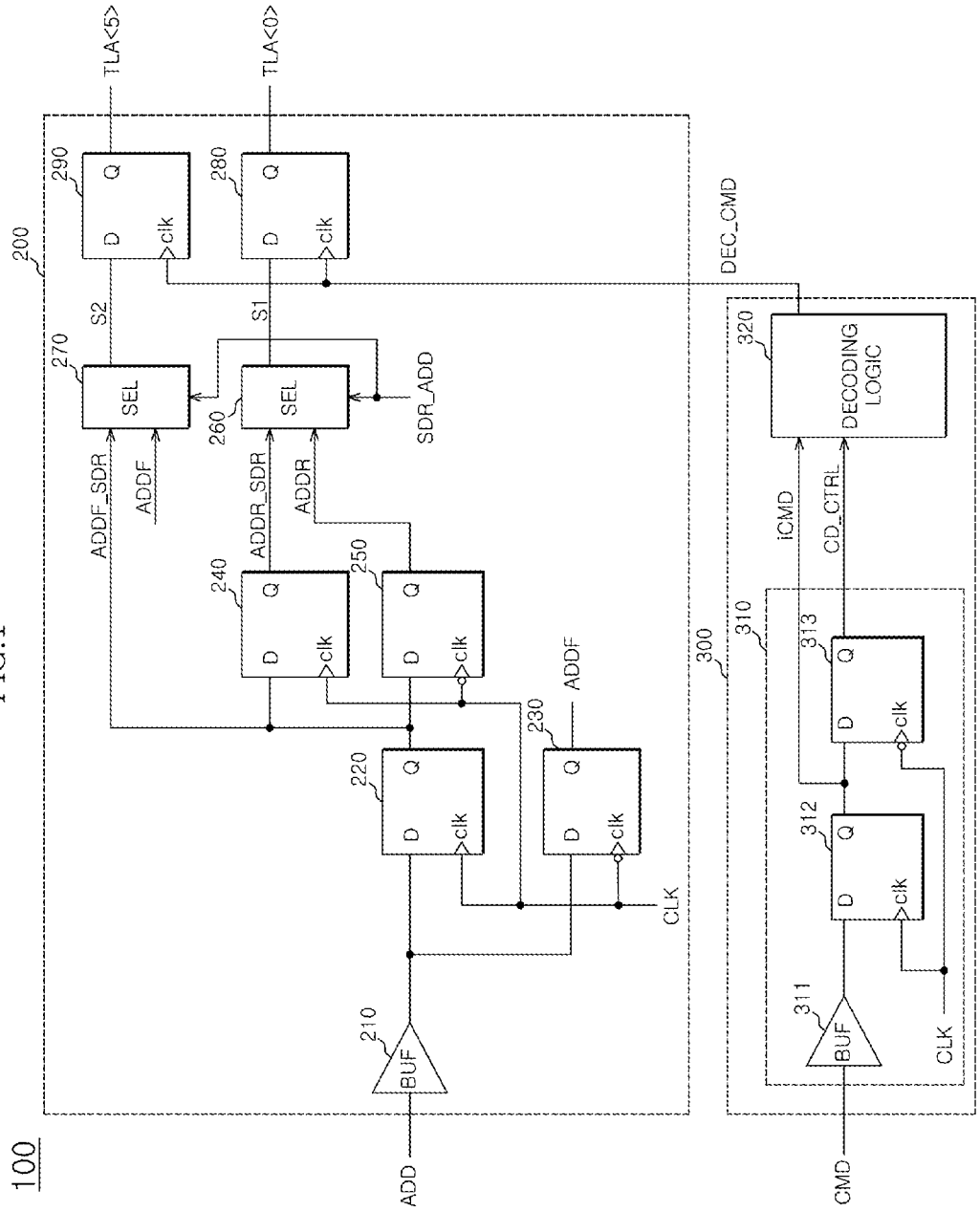
FIG. 1 is a circuit diagram illustrating an address input circuit in accordance with an embodiment of the present invention.

FIG. 1 is a circuit diagram illustrating an address input circuit 100 in accordance with an embodiment of the present invention.

Referring to FIG. 1, the address input circuit 100 in accordance with an embodiment of the present invention may include an address latch unit 200 and a command decoder 300.

The address latch unit 200 is configured to adjust each of latch timings of a first address, for example ADD0, and a second address, for example ADD5, both of which may be sequentially provided by an external, differently from each other according to an address input mode signal SDR_ADD and a command decoding signal DEC_CMD to generate a first and second latch addresses TLA<0> and TLA<5>.

The address latch unit 200 is configured to select each one from signals, which may be respectively latched from the first address ADD0 and the second address ADD5 sequentially provided from the external through a plurality of paths having different timing from one another, according to the address input mode signal SDR_ADD, latch the selected signals according to the command decoding signal DEC_CMD and generate the first and second latch addresses TLA<0> and TLA<5>. Accordingly, the address input circuit 100 may be configured to select each one from a plurality of latch signals generated by latching addresses ADD0 and ADD5 according to a clock signal so that each of the latch timings of the addresses ADD0 and ADD5 are different from one another, according to an address input mode signal SDR_ADD and output the selected signals as latch addresses TLA<0> and TLA <5>.

The address input mode signal SDR_ADD may be a signal for identifying the SDR address input mode (hereinafter, a first address input mode) and the DDR address input mode (hereinafter, a second address input mode). Moreover, the first signal is generated by latching the first address ADD0 for a two period time (2tCK) corresponding to a first clock pulse K and a second clock pulse K+1 following the first clock pulse. The second signal may be generated by latching the second address ADD5 for a one period time corresponding to the second clock pulse K+1.

For example, currently set address input mode is the first address input mode when the address input mode signal SDR_ADD is is logic high and currently set address input mode is the second address input mode when the address input mode signal SDR_ADD is logic low. Accordingly, the first signal may be generated by latching the first address ADD0 for one and a half period time (1.5tCK) corresponding to an amount from a first edge of the first clock pulse K to a second edge of the second clock pulse K+1. The second signal may be generated by latching the second address ADD5 for one and a half period time (1.5tCK) corresponding to an amount from a second edge of the first clock pulse K to the second edge of the second clock pulse K+1.

For example, the address input mode signal SDR_ADD may be set to a desired value using a test mode.

The command decoder 300 is configured to output the command decoding signal DEC_CMD for setting output timings of the latch addresses TLA<0> and TLA<5>, which is generated by decoding a command CMD provided from the external, at a preset timing.

The address latch unit 200 may include a buffer 210, first to sixth latch sections 220 to 250, 280 and 290 and first and second selection sections 260 and 270.

The buffer 210 may buffer an address ADD or adjust an amplitude of the address ADD to a level that may be internally processed and output the adjusted address ADD.

Each of the first to sixth latch sections 220 to 250, 280 and 290 may comprise a flip-flop, wherein each flip-flop indicates an input D, output Q, and clock clk.

The first latch section 220 is configured to latch an output signal of the buffer 210 according to a first edge (hereinafter, a rising edge) of a first clock pulse K or second clock pulse K+1 of a clock signal CLK and generate a first latch signal ADDF_SDR.

The second latch section 230 is configured to latch the output signal and first address ADD0 or second address ADD5 of the buffer 210 according to a second edge (hereinafter, a falling edge) of the first clock pulse K or second clock pulse K+1 of the clock signal CLK and generate a second latch signal ADDF.

The third latch section 240 is configured to latch the first latch signal ADDF_SDR according to the rising edge or first edge of the clock signal CLK and generate a third latch signal ADDR_SDR.

The fourth latch section 250 is configured to latch the first latch signal ADDF_SDR according to the falling edge or second edge of the first clock pulse K or the second clock pulse K+1 of the clock signal CLK and generate a fourth latch signal ADDR.

The first selection section 260 is configured to select one of the third latch signal ADDR_SDR and the fourth latch signal ADDR according to a logic level of the address input mode signal SDR_ADD that is a signal for identifying the first address input mode and the second address input mode and generate a first selection signal S1.

The second selection section 270 is configured to select one of the first latch signal ADDF_SDR and the second latch signal ADDF according to the logic level of the address input mode signal SDR_ADD and generate a second selection signal S2.

The fifth latch section 280 is configured to latch the first selection signal S1 according to the command decoding signal DEC_CMD and generate a first latch address TLA<0>.

The sixth latch section 290 is configured to latch the second selection signal S2 according to the command decoding signal DEC_CMD and generate a second latch address TLA<5>.

The command decoder 300 may include a command latch unit 310 and a decoding logic 320.

The command latch unit 310 is configured to latch the command CMD provided from the external at different timings and generate an internal command iCMD and an output control signal CD_CTRL.

The command latch unit 310 may include a buffer 311 and a first and second latch sections 312 and 313.

The buffer 311 may buffer and output the command CMD.

Each of the first and second latch sections 312 and 313 may comprise a flip-flop.

The first latch section 312 is configured to latch an output signal of the buffer 310 or command according to the rising edge or first edge of the first clock pulse K or second clock pulse K+1 of the clock signal CLK and generate the internal command iCMD.

The second latch section 313 is configured to latch the internal command iCMD according to the falling edge or second edge of the first clock pulse K or second clock pulse K+1 of the clock signal CLK and generate the output control signal CD_CTRL.

The output control signal CD_CTRL may have a delayed timing of ½tCK with reference to the internal command iCMD. The tCK is a period time of the clock signal CLK.

The decoding logic 320 is configured to generate and output the command decoding signal DEC_CMD, which may be generated by decoding the internal command iCMD, in response to the output control signal CD_CTRL.

Operations of the address input circuit 100 described above in accordance with an embodiment of the present invention is described as follows.

Figure 2:
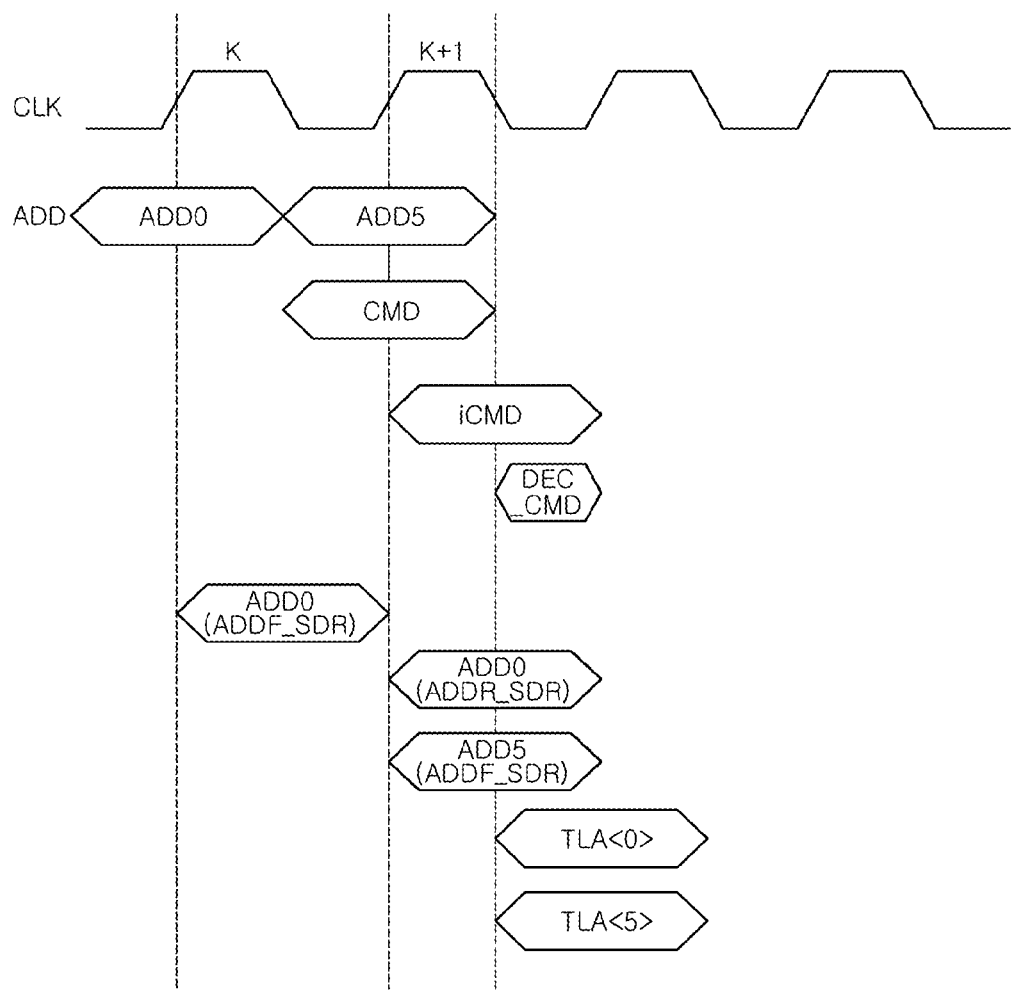
FIG. 2 is a timing diagram illustrating an operation of the address input circuit in the single data rate (SDR) address input mode is (a first address input mode) in accordance with an embodiment of the present invention.

FIG. 2 is a timing diagram illustrating an operation of the address input circuit in the single data rate (SDR) address input mode (a first address input mode) in accordance with an embodiment of the present invention.

Referring to FIG. 2, in case of the SDR address input mode (the first address input mode), test equipment may provide the first address ADD0 and the second address ADD5 to the semiconductor device at the rising edges or first edges of clock pulses (first clock pulse) K and (second clock pulse) K+1 of the clock signal CLK to respectively.

Also, test equipment may provide the command CMD to the semiconductor device at the same timing as the second address ADD5.

The first latch section 220 of the address latch unit 200 may latch the first address ADD0 according to the rising edge of the clock pulse K and generate the first latch signal ADDF_SDR.

In the first address input mode, the address input mode signal SDR_ADD is logic high and thus the first selection section 260 and the second selection section 270 are configured to select the third latch signal ADDR_SDR and the first latch signal ADDF_SDR and generate the first selection signal S1 and the second selection signal S2, respectively.

Therefore, the second selection section 270 may select the first latch signal ADDF_SDR, that is, the first address ADD0 and output the first address ADD0 as the second selection signal S2.

The command decoding signal DEC_CMD is not generated at this moment and thus the sixth latch section 290 may not latch the second selection signal S2.

The third latch section 240 may latch the first latch signal ADDF_SDR, which may be the first address ADD0 latched by the first latch section 220, according to the rising edge of the clock pulse K+1 and generate the third latch signal ADDR_SDR.

The first latch section 220 also may latch the second address ADD5 according to the rising edge of the clock pulse K+1 and generate the first latch signal ADDF_SDR.

Therefore, the first selection section 260 may select the third latch signal ADDR_SDR, that is, the first address ADD0 and output the first address ADD0 as the first selection signal S1.

The second selection section 270 may select the first latch signal ADDF_SDR, that is, the second address ADD5 and output the second address ADD5 as the second selection signal S2.

The first latch section 312 of the command decoder 300 may latch the command CMD according to the rising edge of the clock pulse K+1 and output the latched command CMD as the internal command iCMD.

The second latch section 313 may latch the internal command iCMD according to the falling edge of the clock signal CLK and output the latched internal command iCMD as the output control signal CD_CTRL, timing of which may be delayed with amount of ½tCK with reference to the internal command iCMD.

The decoding logic 320 may output the command decoding signal DEC_CMD having a delayed timing of ½tCK with reference to the internal command iCMD.

Therefore, the fifth latch section 280 of the address latch unit 200 may latch the first selection signal S1, that is, the first address ADD0 according to the command decoding signal DEC_CMD and generate the first latch address TLA<0>.

Also, the sixth latch section 290 may latch the second selection signal S2, that is, the second address ADD5 according to the command decoding signal DEC_CMD and generate the second latch address TLA<5>.

Figure 3:
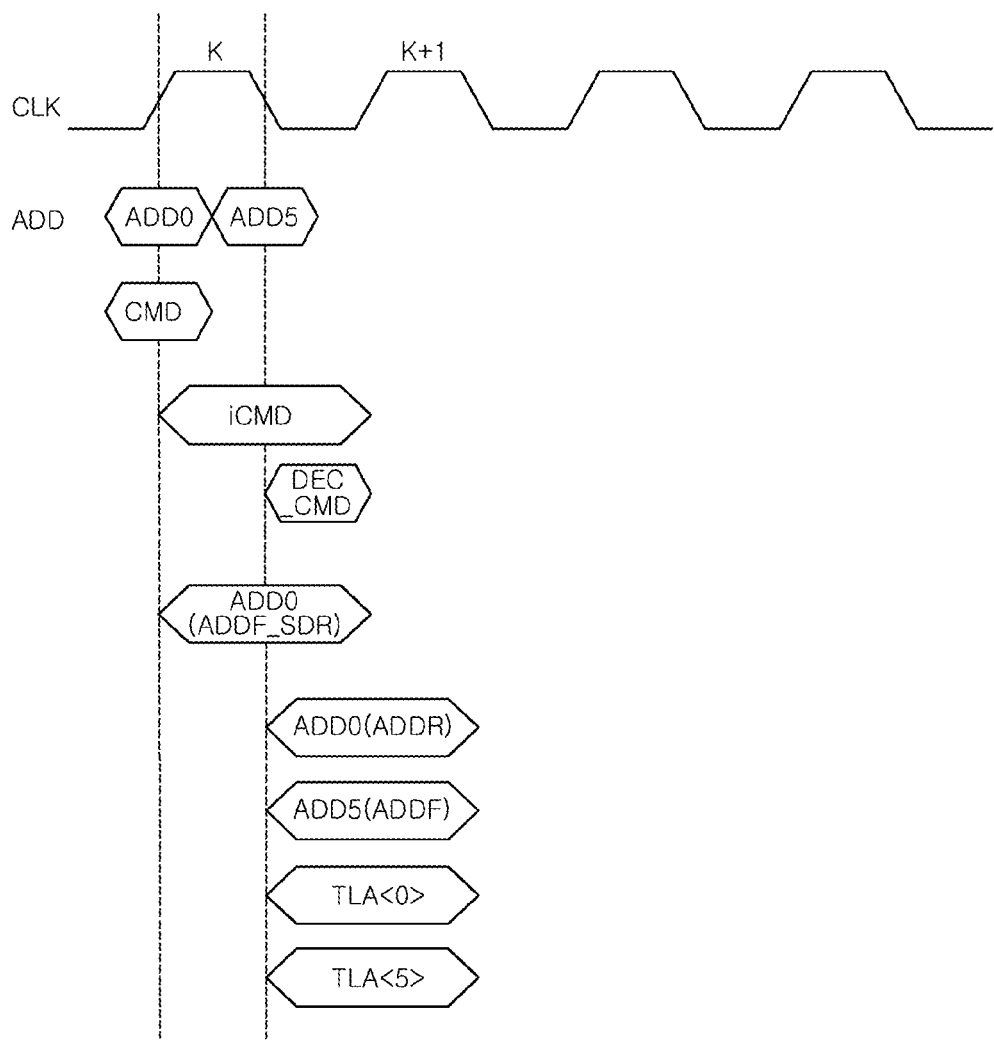
FIG. 3 is a timing diagram illustrating an operation of the address input circuit in the double data rate (DDR) address input mode (a second address input mode) in accordance with an embodiment of the present invention.

FIG. 3 is a timing diagram illustrating an operation of the address input circuit in the double data rate (DDR) address input mode (a second address input mode) in accordance with an is embodiment of the present invention.

Referring to FIG. 3, in case of the DDR address input mode (the second address input mode), test equipment may provide the addresses, for example, the first address ADD0 and the second address ADD5, to the semiconductor device at both of the rising edge or first edge and the falling edge or second edge of clock pulse K of the clock signal CLK, respectively. Clock pulse K+1 is also illustrated.

Also, test equipment may provide the command CMD to the semiconductor device at the same timing as the first address ADD0.

The first latch section 220 of the address latch unit 200 may latch the first address ADD0 according to the rising edge of the clock pulse K and generate the first latch signal ADDF_SDR.

In the second address input mode, the address input mode signal SDR_ADD is logic low and thus the first selection section 260 and the second selection section 270 are configured to select the fourth latch signal ADDR and the second latch signal ADDF and generate the first selection signal S1 and the second selection signal S2, respectively.

Therefore, the second selection section 270 may select the first latch signal ADDF_SDR, that is, the first address ADD0 and output the first address ADD0 as the second selection signal S2.

The command decoding signal DEC_CMD is not generated at this moment and thus the sixth latch section 290 may not latch the second selection signal S2.

The fourth latch section 250 may latch the first latch signal ADDF_SDR, that is, the first address ADD0 according to the falling edge of the clock pulse K and generate the fourth latch signal ADDR.

The second latch section 220 also may latch the second address ADD5 according to the falling edge of the clock pulse K and generate the second latch signal ADDF.

Therefore, the first selection section 260 may select the fourth latch signal ADDR, that is, the first address ADD0 and output the first address ADD0 as the first selection signal S1.

The second selection section 270 may select the second latch signal ADDF, that is, the second address ADD5 and output the second address ADD5 as the second selection signal S2.

The first latch section 312 of the command decoder 300 may latch the command CMD according to the rising edge of the clock pulse K and output the latched command CMD as the internal command iCMD.

The second latch section 313 may latch the internal command iCMD according to the falling edge of the clock signal CLK and output the latched internal command iCMD as the output control signal CD_CTRL, timing of which may be delayed with amount of ½tCK with reference to the internal command iCMD.

The decoding logic 320 may output the command decoding signal DEC_CMD having a delayed timing of ½tCK with reference to the internal command iCMD.

Therefore, the fifth latch section 280 of the address latch unit 200 may latch the first selection signal S1, that is, the first address ADD0 according to the command decoding signal DEC_CMD and generate the first latch address TLA<0>.

Also, the sixth latch section 290 may latch the second selection signal S2, that is, the second address ADD5 according to the command decoding signal DEC_CMD and generate the second latch address TLA<5>.

While certain embodiments have been described above, it will be understood to those skilled in the art that the embodiments described are by way of example only. Accordingly, the address input circuit of a semiconductor memory apparatus described herein should not be limited based on the described embodiments. Rather, the address input circuit of a semiconductor memory apparatus described herein should only be limited in light of the claims that follow when taken in conjunction with the above description and accompanying drawings.

What is claimed is:

1. An address input circuit of a semiconductor device comprising:
    an address latch unit configured to generate latch addresses, by latching addresses according to different edges of a clock signal and selecting and latching one of latched signals according to an address input mode signal and a command decoding signal; and
    a command decoder configured to generate the command decoding signal by decoding a command provided from the external,
    wherein the address latch unit comprises:
    a first latch section configured to latch the addresses according to a first edge of a clock signal and generate a first latch signal;
    a second latch section configured to latch the addresses according to a second edge of the clock signal and generate a second latch signal;
    a third latch section configured to latch the first latch signal according to the first edge of the clock signal and generate a third latch signal;
    a fourth latch section configured to latch the first latch signal according to the second edge of the clock signal and generate a fourth latch signal;
    a first selection section configured to select one of the third latch signal and the fourth latch signal according to the address input mode signal and generate a first selection signal;
    a second selection section configured to select one of the first latch signal and the second latch signal according to the address input mode signal and generate a second selection signal;

a fifth latch section configured to latch the first selection signal according to the command decoding signal and generate a first latch address; and a sixth latch section configured to latch the second selection signal according to the command decoding signal and generate a second latch address.

2. The address input circuit of claim 1, wherein the address input mode signal is a signal for identifying a first address input mode and a second address input mode.

3. The address input circuit of claim 2, wherein the first address input mode is a single data rate (SDR) address input mode.

4. The address input circuit of claim 2, wherein the second address input mode is a double data rate (DDR) address input mode.

5. The address input circuit of claim 1, wherein the address input mode signal is set to a desired value using a test mode.

6. The address input circuit of claim 1, wherein the command decoder comprises:
a command latch unit configured to latch the command at different timings and generate an internal command and an output control signal; and
a decoding logic configured to decode the internal command in response to the output control signal and generate the command decoding signal.

7. The address input circuit of claim 6, wherein the command latch unit comprises:
a first latch section configured to latch the command according to a first edge of a clock signal and generate the internal command; and
a second latch section configured to latch the internal command according to a second edge of the clock signal and generate the output control signal.

8. The address input circuit of claim 7, wherein the output control signal has a delayed timing of ½tCK with reference to the internal command where the tCK is a period time of the clock signal.

9. An address input circuit of a semiconductor device configured to select each one from a plurality of latch signals generated by latching addresses using a clock signal according to a first address input mode or a second address input mode so that each of latch timings of the addresses are different from one another, and output the selected signals as latch addresses,
wherein the address input circuit comprises an address latch unit configured to latch a first signal and a second signal and generate the latch addresses in the first address input mode,
wherein the first signal is generated by latching a first address for a two period time (2tCK) corresponding to a first clock pulse of the clock signal and a second clock pulse following the first clock pulse, and
wherein the second signal is generated by latching a second address for a one period time corresponding to the second clock pulse.

10. The address input circuit of claim 9, further comprising a command decoder configured to decode a command provided from an external and generate a command decoding signal for setting output timings of the latch addresses.

11. The address input circuit of claim 9, wherein the address latch unit is configured to latch a first signal and a second signal and generate the latch addresses in the second address input mode,
wherein the first signal is generated by latching the first address for one and half period time (1.5tCK) corresponding to an amount from a first edge of the first clock pulse to a second edge of the second clock pulse, and wherein the second signal is generated by latching the second address for one and half period time (1.5tCK) corresponding to an amount from a second edge of the first clock pulse to the second edge of the second clock pulse.

12. The address input circuit of claim 11, wherein the first address input mode is a single data rate (SDR) address input mode in which the first address and the second address are respectively provided with reference to the first edge of the first clock pulse and a first edge of the second clock pulse.

13. The address input circuit of claim 12, wherein the second address input mode is a double data rate (DDR) address input mode in which the first address and the second address are respectively provided with reference to the first edge and the second edge of the first clock pulse.

14. The address input circuit of claim 11, wherein the address latch unit comprises:
a first latch section configured to latch the first address or the second address according to a first edge of the first clock pulse or the second clock pulse and generate a first latch signal;
a second latch section configured to latch the first address or the second address according to a second edge of the first clock pulse or the second clock pulse and generate a second latch signal;
a third latch section configured to latch the first latch signal according to the first edge of the first clock pulse or the second clock pulse and generate a third latch signal;
a fourth latch section configured to latch the first latch signal according to the second edge of the first clock pulse or the second clock pulse and generate a fourth latch signal;
a first selection section configured to select one of the third latch signal and the fourth latch signal according to an address input mode signal, which is a signal for identifying the first address input mode and the second address input mode, and generate a first selection signal;
a second selection section configured to select one of the first latch signal and the second latch signal according to the address input mode signal and generate a second selection signal;
a fifth latch section configured to latch the first selection signal according to the command decoding signal and generate a first latch address; and
a sixth latch section configured to latch the second selection signal according to the command decoding signal and generate a second latch address.

15. The address input circuit of claim 10, wherein the command decoder comprises:
a command latch unit configured to latch the command at different timings and generate an internal command and an output control signal; and
a decoding logic configured to decode the internal command according to the output control signal and generate the command decoding signal.

16. The address input circuit of claim 15, wherein the command latch unit comprises:
a first latch section configured to latch the command according to a first edge of the first clock pulse or the second clock pulse and generate the internal command; and
a second latch section configured to latch the internal command according to a second edge of the first clock pulse or the second clock pulse and generate the output control signal.

17. The address input circuit of claim 15, wherein the output control signal has a delayed timing of ½tCK with reference to the internal command.

18. An address input circuit of a semiconductor device comprising:
- a first latch section configured to latch addresses according to a first edge of a clock signal and generate a first latch signal;
- a second latch section configured to latch the addresses according to a second edge of the clock signal and generate a second latch signal;
- a third latch section configured to latch the first latch signal according to the first edge of the clock signal and generate a third latch signal;
- a fourth latch section configured to latch the first latch signal according to the second edge of the clock signal and generate a fourth latch signal;
- a first selection section configured to select one of the third latch signal and the fourth latch signal according to an address input mode signal; and
- a second selection section configured to select one of the first latch signal and the second latch signal according to the address input mode signal.

19. The address input circuit of claim 18, further comprising:
- a fifth latch section configured to latch an output of the first selection section according to a command decoding signal and generate a first latch address; and
- a sixth latch section configured to latch an output of the second selection section according to the command decoding signal and generate a second latch address.

20. The address input circuit of claim 18, further comprising a command decoder configured to decode a command provided from an external of the semiconductor device and generate the command decoding signal for setting output timings of the latch addresses.

21. The address input circuit of claim 18, wherein the address input mode signal is a signal for identifying a first address input mode and a second address input mode.

22. The address input circuit of claim 21, wherein the first address input mode is a single data rate (SDR) address input mode, and the second address input mode is a double data rate (DDR) address input mode.

* * * * *